(12) United States Patent
Kang et al.

(10) Patent No.: US 9,165,672 B2
(45) Date of Patent: Oct. 20, 2015

(54) NONVOLATILE MEMORY DEVICE COMPRISING PAGE BUFFER AND OPERATION METHOD THEREOF

(71) Applicant: Samsung Electronics Co., Ltd., Suwon-Si, Gyeonggi-Do (KR)

(72) Inventors: Dongku Kang, Sengnam-si (KR); Dae Yeal Lee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/077,606

(22) Filed: Nov. 12, 2013

(65) Prior Publication Data

US 2014/0153329 A1  Jun. 5, 2014

(30) Foreign Application Priority Data

Dec. 5, 2012 (KR) .................. 10-2012-0140387

(51) Int. Cl.
G11C 11/34 (2006.01)
G11C 16/34 (2006.01)
G11C 16/26 (2006.01)
G11C 7/10 (2006.01)
G11C 17/06 (2006.01)

(52) U.S. Cl.
CPC .......... *G11C 16/3481* (2013.01); *G11C 7/1039* (2013.01); *G11C 16/26* (2013.01); *G11C 17/06* (2013.01)

(58) Field of Classification Search
USPC ............. 365/185.03, 185.12, 185.17, 185.18, 365/185.19, 185.21, 185.22, 185.25, 185.33
See application file for complete search history.

(56) References Cited

U.S. PATENT DOCUMENTS

| 6,621,741 | B2 * | 9/2003 | Yano ........................ 365/185.12 |
| 7,203,791 | B2 | 4/2007 | Lee |
| 7,257,027 | B2 | 8/2007 | Park |
| 7,295,470 | B2 | 11/2007 | Park et al. |
| 7,403,431 | B2 | 7/2008 | Kim |
| 7,518,945 | B2 | 4/2009 | Kim |
| 7,719,897 | B2 | 5/2010 | Lee et al. |
| 7,885,113 | B2 | 2/2011 | Ju |
| 8,059,460 | B2 * | 11/2011 | Jeong et al. .............. 365/185.12 |
| 8,179,722 | B2 * | 5/2012 | Huh ........................ 365/185.12 |
| 8,208,308 | B2 * | 6/2012 | Han et al. ................. 365/185.22 |
| 8,289,780 | B2 | 10/2012 | Yun et al. |
| 8,305,813 | B2 * | 11/2012 | Lee .......................... 365/185.22 |
| 8,335,107 | B2 * | 12/2012 | Lee .......................... 365/185.22 |
| 8,395,940 | B2 * | 3/2013 | Huh ........................ 365/185.12 |
| 8,570,801 | B2 * | 10/2013 | Lim et al. ................. 365/185.03 |

(Continued)

FOREIGN PATENT DOCUMENTS

| KR | 10-0539445 B1 | 12/2005 |
| KR | 2012-0077275 A | 7/2012 |

*Primary Examiner* — Trong Phan
(74) *Attorney, Agent, or Firm* — Harness, Dickey & Pierce, PLC

(57) ABSTRACT

A nonvolatile memory device is provided which includes a cell array including a plurality of memory cells; a page buffer unit including a plurality of page buffers and configured to sense whether programming of selected memory cells is completed, at a program verification operation; and a control logic configured to provide a set pulse for setting data latches of each of the page buffers to a program inhibit state according to the sensing result, wherein the control logic provides the set pulse to at least two different page buffers such that data latches of the at least two different page buffers are set.

14 Claims, 15 Drawing Sheets

(56) References Cited

U.S. PATENT DOCUMENTS

| | | | |
|---|---|---|---|
| 8,687,423 B2 * | 4/2014 | Yoo | 365/185.12 |
| 8,724,395 B2 * | 5/2014 | Park et al. | 365/185.22 |
| 8,804,433 B2 * | 8/2014 | Lee | 365/185.22 |

* cited by examiner

NONVOLATILE MEMORY DEVICE COMPRISING PAGE BUFFER AND OPERATION METHOD THEREOF

CROSS-REFERENCE TO RELATED APPLICATIONS

A claim for priority under 35 U.S.C. §119 is made to Korean Patent Application No. 10-2012-0140387 filed Dec. 5, 2012, in the Korean Intellectual Property Office, the entire contents of which are hereby incorporated by reference.

BACKGROUND

The inventive concepts described herein relate to a semiconductor memory device, and more particularly, relate to a nonvolatile memory device including a page buffer and/or an operating method.

Semiconductor memory devices may be volatile or nonvolatile. The volatile semiconductor memory devices may perform read and write operations at a high speed, while contents stored therein may be lost when powered-off. The nonvolatile semiconductor memory devices may retain contents stored therein even when powered-off. The nonvolatile semiconductor memory devices may be used to store contents which must be retained regardless of whether they are powered.

A flash memory device is a typical nonvolatile semiconductor memory device. The flash memory device may be widely used as a voice and image data storing medium of information appliances such as a computer, a cellular phone, a PDA, a digital camera, a camcorder, a voice recorder, an MP3 player, a handheld PC, a game machine, a facsimile, a scanner, a printer, and the like.

In recent years, large-capacity, high-speed input/output and low-power techniques on nonvolatile memories may have been developed for mounting them on mobile devices (e.g., a smart phone).

SUMMARY

According to example embodiments of the inventive concepts a nonvolatile memory device is provided. The nonvolatile memory device may comprise a cell array including a plurality of memory cells; a page buffer unit including a plurality of page buffers configured to perform a program verification operation in order to sense whether programming of selected memory cells is completed; and control logic configured to provide a set pulse for setting data latches of each of the plurality of page buffers to a program inhibit state according to a result of the program verification operation. The control logic may provide the set pulse to at least two different page buffers such that data latches of the at least two different page buffers are set.

According to another example embodiment of the inventive concepts an operating method of a nonvolatile memory device is provided. The nonvolatile memory device may include a first page buffer having a first sensing latch, a first sensing node and a first data latch and a second data latch having a second sensing latch, a second sensing node and a second data latch. The operating method may comprise developing the first and second sensing nodes according to data stored at the first and second data latches; setting the first data latch according to a voltage level of the first sensing node developed in response to a set pulse; and setting the second data latch according to a voltage level of the second sensing node developed in response to the set pulse.

According to another example embodiment, a nonvolatile memory device is provided. The nonvolatile memory device includes a first page buffer including a first data latch; a second page buffer including a second data latch; and control logic configured to control the first page buffer and the second page buffer by applying a set pulse simultaneously to both the first page buffer and the second page buffer. The first page buffer may be configured to store first data in the first data latch in response to the set pulse, and the second page buffer may be configured to store second data in the second data latch in response to the set pulse.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
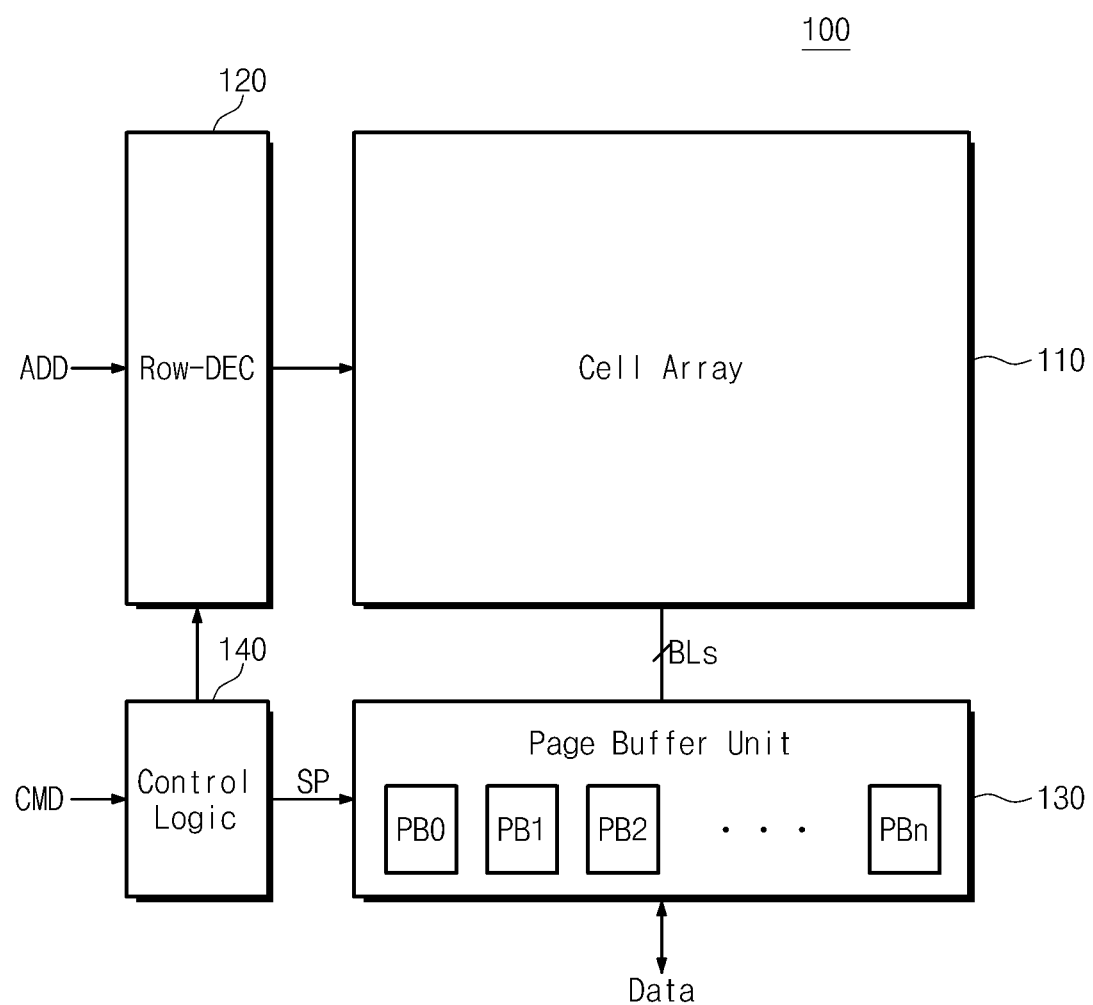
FIG. 1 is block diagram schematically illustrating nonvolatile memory device 100 according to an embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, features and functions of the inventive concepts will be exemplarily described using a flash memory device as a nonvolatile storage medium. However, the inventive concepts is not limited thereto. For example, the storage medium may be formed of a PRAM, an MRAM, a ReRAM, a FRAM, a NOR flash memory, or the like.

The inventive concepts may be implemented by different embodiments or applied thereto. Further, detailed description may be modified or changed according to viewpoints and applications without escaping from the scope, spirit and other objects of the inventive concepts. Below, the inventive concepts will be described with reference to accompanying drawings.

FIG. 1 is block diagram schematically illustrating nonvolatile memory device 100 according to an embodiment of the inventive concepts. Referring to FIG. 1, a nonvolatile memory device 100 may include a cell array 110, a row decoder 120, a page buffer unit 130, and control logic 140.

The cell array 110 may be connected with the row decoder 120 through word lines and selection lines. The cell array 110 may be connected with the page buffer unit 130 through bit lines. The cell array 110 may include a plurality of NAND cell strings, each of which has a channel formed in a horizontal or vertical direction. The cell array 110 of the inventive concepts may include a number of memory cells forming the NAND cell strings. The memory cells may be programmed, erased or read using bit line and word line voltages. In particular, each memory cell of the cell array 110 may be a multi-level cell storing at least two bits.

The row decoder 120 may select one of a plurality of memory blocks of the cell array 110 in response to an address ADD. The row decoder 120 may select one of a plurality of word lines in the selected memory block. The row decoder 120 may transfer a voltage corresponding to a mode of operation to a selected word line. At a program operation, the row decoder 120 may transfer a program voltage or a verification voltage to a selected word line and a pass voltage to an unselected word line. At a read operation, the row decoder 120 may transfer a selection read voltage to a selected word line and a non-selection read voltage to an unselected word line.

The page buffer unit 130 may operate as a write driver at a program operation and a sense amplifier at a read operation. At a program operation, the page buffer unit 130 may provide a bit line of the cell array 110 with a bit line voltage corresponding to data to be programmed. At a read or verification read operation, the page buffer unit 130 may sense data stored in a selected memory cell via a bit line. The page buffer unit 130 may include a plurality of page buffers PB0 to PBn each connected with one bit line or two bit lines.

At a program verification operation, each of the page buffers PB0 to PBn may store data sensed through a bit line at a sensing latch S_LTCH. A data latch, at which target data is stored, may be set according to data stored at the sensing latch S_LTCH. For example, in the event that the sensed data indicates that programming is completed, the data latch may be switched into a program inhibit setting on a selected memory cell at a next program loop.

The page buffer unit 130 may be provided with a set pulse for storing data stored at the sensing latch S_LTCH at the data latch. The set pulse may be provided from the control logic 140. Each of the page buffers PB0 to PBn may respond to the set pulse to set the data latch according to data stored at the sensing latch S_LTCH. In the page buffer unit 130 of the inventive concepts, data latches of at least two page buffers may be set at the same time in response to a set pulse provided at the same time slot. With such a characteristic of the page buffer unit 130, a time taken to set a data latch, at which target data is stored, at a program verification operation may be reduced. Thus, in case of the nonvolatile memory device 100 having the page buffer unit 130, the number of cycles for a program operation may be remarkably reduced.

The control logic 140 may control the page buffer unit 130 and the row decoder 120 in response to a command CMD transferred from an external device. The control logic 140 may control the page buffer unit 130 and the row decoder 120 such that programming, reading and erasing on selected memory cells are performed according to the command CMD.

The control logic 140 may generate a set pulse SP to be provided to the page buffer unit 130. Data latch setting on at least two page buffers may be performed through a set pulse generated from the control logic 140. For example, an most significant bit (MSB) latch of a page buffer PB0 and an least significant bit (LSB) latch of a page buffer PB4 may be simultaneously set by the set pulse SP.

A time taken to perform a program verification operation may be reduced by using the set pulse SP, and a power consumed to set a data latch may be reduced or otherwise eliminated.

Figure 2:
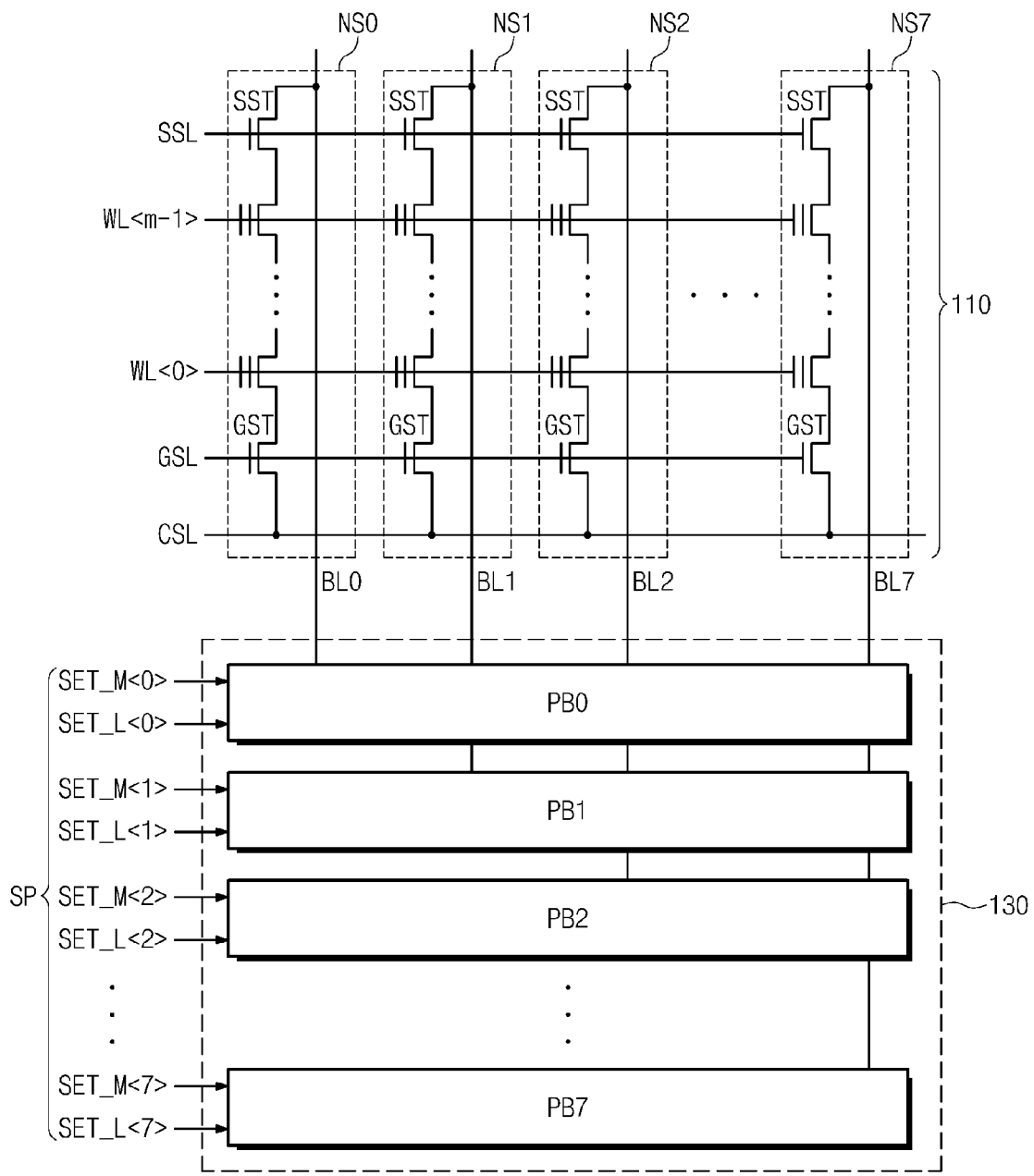
FIG. 2 is a block diagram schematically illustrating a page buffer unit according to an embodiment of the inventive concepts.

FIG. 2 is a block diagram schematically illustrating a page buffer unit according to an embodiment of the inventive concepts.

Referring to FIG. 2, page buffers PB0 to PB7 may be connected with bit lines BL0 to BL7, respectively. The bit lines BL0 to BL7 may be connected with NAND cell strings NS0 to NS7, respectively.

The NAND cell strings NS0 to NS7 of a cell array 110 may be connected with the bit lines BL0 to BL7 through string selection transistors SST, respectively. The NAND cell strings NS0 to NS7 may be connected with a common source line CSL through ground selection transistors GST. At a program operation, a program voltage and/or a verification voltage may be applied to a selected word line WL <0> through WL <m−1>.

A page buffer PB0 may be connected with the NAND cell string NS0 through the bit line BL0. At a program operation, the page buffer PB0 may verify whether programming of a memory cell selected from memory cells in the NAND cell string NS0 is completed. When a verification voltage is applied to a word line connected with the selected memory cell, the page buffer PB0 may sense whether the selected memory cell is an on cell or an off cell, and may store the sensed result at sensing latch S_LTCH. The page buffer PB0 may set a data latch M_LTCH for storing an MSB in response to latch set signal SET_M<0> and a data latch L_LTCH for storing an LSB in response to a latch set signal SET_L<0>.

Target bits to be programmed at the selected memory cells may be stored at the data latches M_LTCH and L_LTCH before a verification operation. Logical values of the data latches M_LTCH and L_LTCH may be set to a logical 1 by the latch set signals SET_L<0> and SET_M<0>. Thus, the selected memory cell may be program inhibited at subsequent program loops.

The page buffers PB1 to PB7 may operate the same as the page buffer PB0 except that they are provided with latch set signals SET_M<1> to SET_M<7> and SET_L<1> to SET_L<7>. At least one of the page buffers PB1 to PB7 may be supplied with the latch set signal SET_M<0> at the same time to set the data latch L_LTCH for storing an LSB. Also, at least one of the page buffers PB1 to PB7 may be supplied with the latch set signal SET_L<0> at the same time to set the data latch M_LTCH for storing an MSB.

With the above description, a set pulse may be provided as latch set signals of different page buffers at the same time. Thus, the number of operating cycles for a program verification operation on a multi-level cell may be reduced. A dynamic power may be reduced by reducing the number of set pulses applied at the program verification operation.

Figure 3:
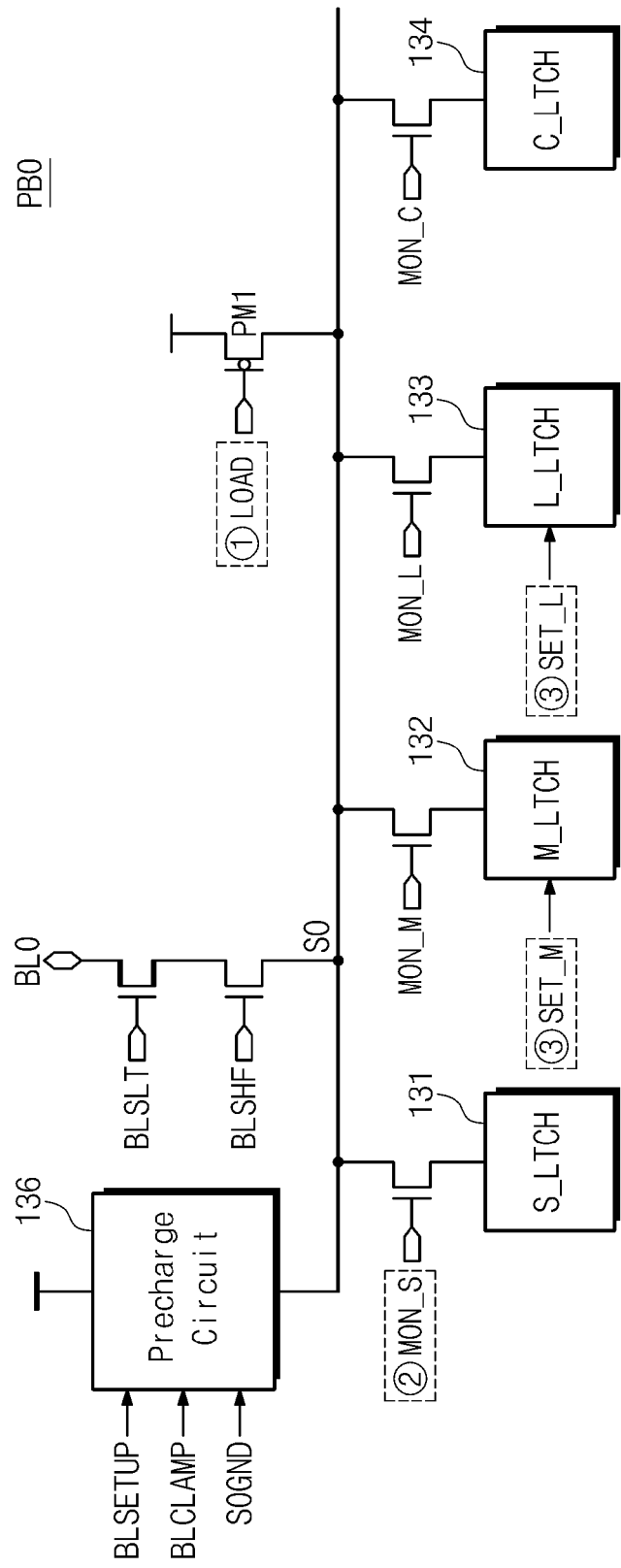
FIG. 3 is a block diagram schematically illustrating a page buffer according to an embodiment of the inventive concepts.

FIG. 3 is a block diagram schematically illustrating a page buffer according to an embodiment of the inventive concepts.

Referring to FIG. 3, a page buffer PB0 connected with a bit line BL0 may be connected with memory cells in a NAND cell string NS0. The page buffer PB0 may include a sensing node SO connected with the bit line BL0. The page buffer PB0 may include may include a sensing latch 131 (labeled as "S_LTCH" in FIG. 3), data latches 132 and 133 (labeled as "M_LTCH" and "L_LTCH", respectively, in FIG. 3), a cache latch 134 (labeled as "C_LTCH" in FIG. 3), and a pre-charge circuit 136 which are connected with the sensing node SO. Additionally, sensing latch 131 may be coupled with control signal MON_S; data latches 132 and 133 may be coupled with control signals MON_M and MON_L, respectively; and cache latch 134 may be coupled with control signal MON_C.

At a program verification operation in which a verification voltage Vfy is applied to a word line connected with a selected memory cell, the page buffer PB0 may pre-charge the bit line BL0 and sense an on/off state of a selected memory cell. At this time, the sensing node SO may be provided with a develop result of the bit line BL0 which is developed according to whether the selected memory cell is turned on or off. Control logic 140 may activate a control signal LOAD. The page buffer PB0 may pre-charge the sensing node SO in response to an activation of the control signal LOAD. This operation may be made to transfer the develop result of the bit line BL0 to the sensing node SO. The control logic 140 may apply at least one of the control signal BLSHF and/or the control signal BLSLT to the page buffer PB0 such that the bit line BL0 is connected with the sensing node SO. A level of the sensing node SO may vary according to a potential of the bit line BL0. This operation may be referred to sensing node develop. Sensing data may be stored at the sensing latch 131 by a potential of the sensing node SO developed.

Afterwards, the data latches 132 and 133 may be set according to the sensing data stored at the sensing latch 131. In FIG. 3, reference numbers ①, ② and ③ are used to indicate an execution order.

First, the control signal LOAD for pre-charging the sensing node SO may be activated to transfer data of the sensing latch 131 to the data latch 132 (①). As the control signal LOAD is activated, the sensing node SO may be charged with a driving voltage (VDD) level. A control signal MON_S may be activated such that the sensing node SO is developed according to a data state of the sensing latch 131 (②). When latch set signals SET_M<0> and SET_L<0> are activated, one of the data latches 132 and 133 may be set according to a level of the sensing node SO.

At a program operation, data corresponding to a target state may be stored at the data latches 132 and 133. In the event that target data of "01" is stored at the data latches 132 and 133 and a memory cell sensed is an off cell (program passed cell), a logical 0 may be latched by the sensing latch 131. The sensing node SO may be developed to a logical 1 by a sensing node develop operation. At this time, if the latch set signal SET_L<0> or the latch set signal SET_M<0> is activated, the data latches 132 and 133 may be set to a logical 1, respectively. This may mean that target data is changed from "01" to "11". The selected memory cell may be program inhibited at subsequent program loops.

In the event that the memory cell sensed is an on cell (e.g., a program failed cell), a logical 1 may be latched by the sensing latch 131. The sensing node SO may be developed to a logical 0 by the sensing node develop operation. At this time, a ground transistor (not shown) may maintain a turn-off state. Although the latch set signal SET_L<0> or the latch set signal SET_M<0> is activated, the data latches 132 and 133 may retain a logical "01" corresponding to the target state. According to various embodiments, to improve a program speed, the latch set signals SET_L<0> and SET_M<0> may be applied at the same time. If the latch set signals SET_L<0> and SET_M<0> are simultaneously provided with the selected memory cell being an on cell, latches may be electrically connected. This may mean a transition to a logically unclear sate.

With a set pulse applying method of the inventive concepts, a set pulse may be provided to at least two page buffers as a latch set signal. A data latch M_LTCH of a page buffer for storing an MSB and a data latch L_LTCH of another page buffer for storing an LSB may be set by a set pulse. Thus, although data latches in a page buffer may be set by a set pulse, an abnormal operation may not be generated.

The cache latch 134 may be used to temporarily store data provided from an external device. At a program operation, target data stored at the cache latch 134 may be sequentially stored at the data latches 132 and 133.

Figure 4:
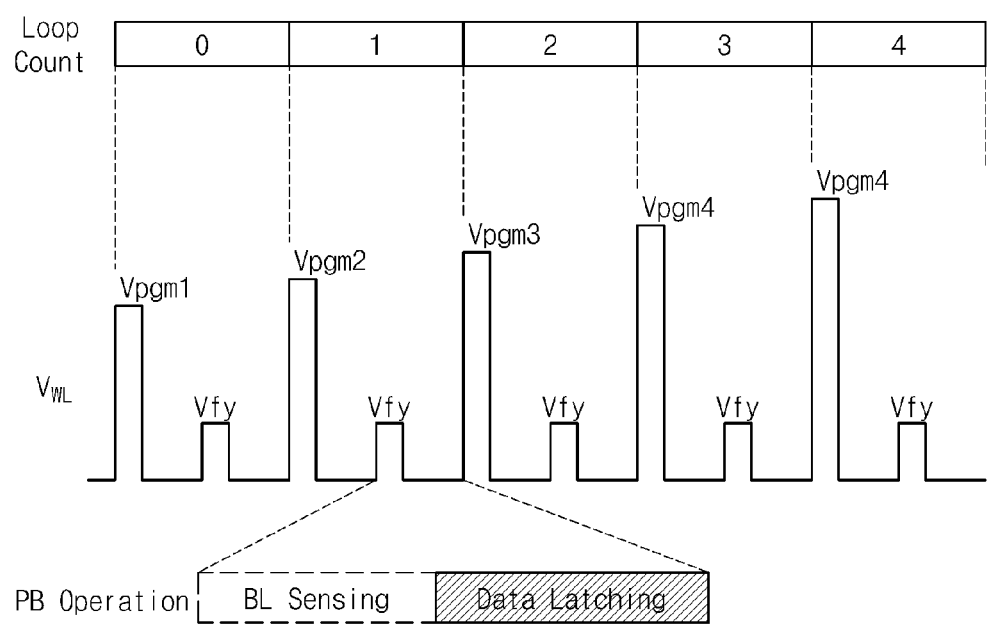
FIG. 4 is a timing diagram describing a program operation according to an embodiment of the inventive concepts.

FIG. 4 is a timing diagram describing a program operation according to an example embodiment of the inventive concepts.

Referring to FIG. 4, a program operation may include a plurality of program loops. In each program loop, a program voltage VpgmN (N being a natural number) and a verification voltage Vfy may be applied to a word line connected with a selected memory cell in turn.

For example, a program loop corresponding to a loop count of 1 may include a program execute duration where a program voltage Vpgm2 is applied to a selected word line and a program verification duration where a verification voltage Vfy is applied to the selected word line. In FIG. 4, voltage applied to the selected word line is represented by $V_{WL}$. The program verification duration may be divided into two durations according to an operation of a page buffer (labeled as "PB Operation in FIG. 4), that is, a bit line sensing duration (labeled as "BL Sensing" in FIG. 4) and a data latch duration (labeled as "Data Latching" in FIG. 4). During the bit line sensing duration, whether a selected memory cell is an on cell or an off cell may be detected through a bit line. Data may be stored at a sensing latch S_LTCH during the bit line sensing duration. During the data latch duration, data in a data latch may be changed to inhibit data according to data temporarily stored at the sensing latch S_LTCH.

Figure 5:
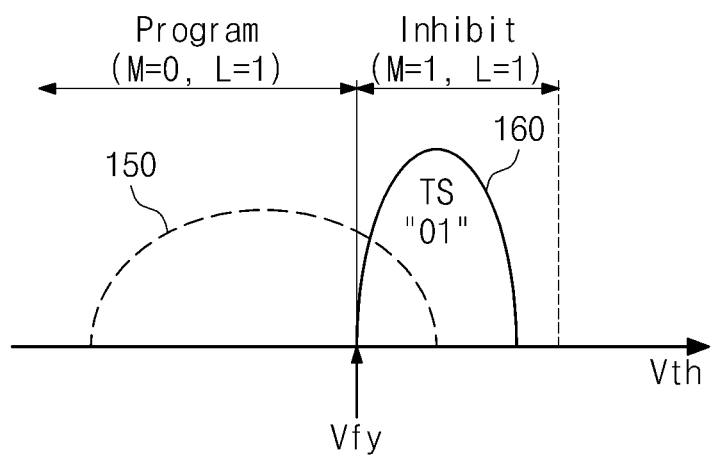
FIG. 5 is a diagram describing a program operation of a selected memory cell.

FIG. 5 is a diagram describing a program operation of a selected memory cell.

Referring to FIG. 5, a selected memory cell may be shifted from a threshold voltage distribution 150 to a threshold voltage distribution 160 corresponding to a target state TS according to an increase in a program loop. According to the example embodiment shown in FIG. 5, it is assumed that a memory cell is a multi-level cell storing 2-bit data and the target state TS is a program state corresponding to "01" data.

As a program voltage Vpgm is provided to the selected memory cell, a threshold voltage of the selected memory cell may gradually increase. In program loops where a threshold voltage Vth of the selected memory cell is lower than a verification voltage Vfy, although a program verification operation is performed, data latches 132 and 133 may maintain "01" data corresponding to the target state TS. For example, as shown in FIG. 5, the "M=0" and the "L=1" represents the data latches 132 and 133 maintaining "01" data when the threshold voltage Vth of the selected memory cell is lower than a verification voltage Vfy as can be seen by the left portion of the graph labeled "Program". If a threshold voltage Vth of the selected memory cell is higher than the verification voltage Vfy, each of the data latches 132 and 133 may be set to a logical 1. In subsequent program loops, a page buffer may provide a bit line voltage for program inhibit according to setting of the data latches 132 and 133. For example, as shown by the right portion of the graph of FIG. 5, the "M=1" and the "L=1" represents the data latches 132 and 133 maintaining "11" data when a threshold voltage Vth of the selected memory cell is higher than a verification voltage Vfy as can be seen by the right portion of the graph labeled "Inhibit".

An operation of updating data of the data latches M_LTCH and L_LTCH according to whether a selected memory cell is an 'on cell' or an 'off cell' may be referred to a data latch setting operation. With the data latch setting operation, data of data latches may maintain a target state or changed into program inhibit data (e.g., "11").

Figure 6:
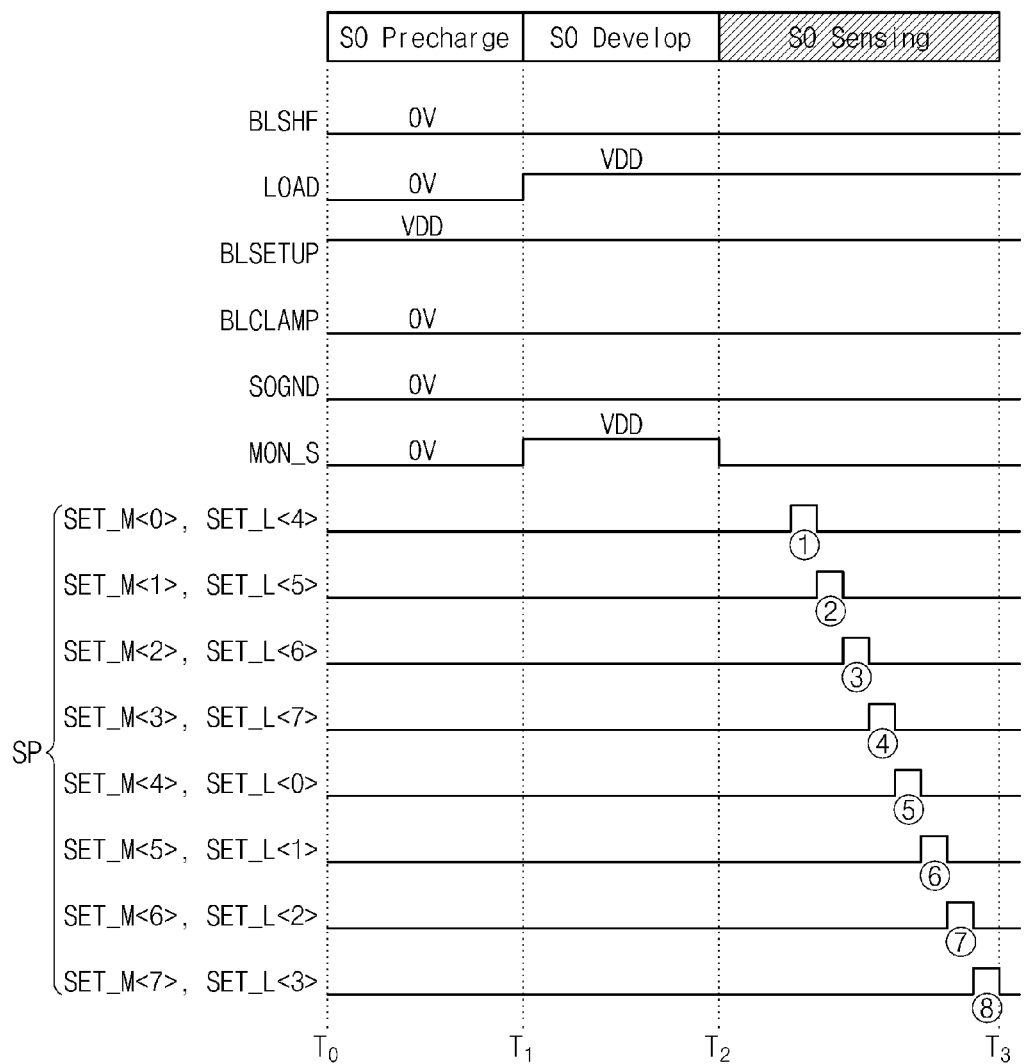
FIG. 6 is a timing diagram schematically illustrating a data latch setting operation of a page buffer according to an embodiment of the inventive concepts.

FIG. 6 is a timing diagram schematically illustrating a data latch setting operation of a page buffer according to an example embodiment of the inventive concepts. A data latch setting operation may be divided into three steps according to sensing data stored at a sensing latch S_LTCH of each page buffer.

At T0, a sensing node SO may be pre-charged. This may be achieved by setting a control signal LOAD to a low level (or, 0V). A transistor PM1 may be turned on by the control signal LOAD, so that a level of the sensing node SO increases up to a VDD level or a predetermined voltage level. At this time, control signals BLSHF, BLCLAMP, SOGND, and MON_S may have a level of 0V and a control signal BLSETUP may have a VDD level.

At T1, the sensing node SO may be developed. This may be achieved by setting the control signals LOAD and MON_S to a VDD level. At this time, the charged sensing node SO may be selectively discharged to a ground according to data stored at a sensing latch 131 (refer to FIG. 3). A ground transistor (not shown) for grounding the data latches 132 and 133 may be turned on or off according to a voltage of the sensing node SO.

At T2, a data latch setting operation may be performed using a sensing result of the sensing node SO. There may be applied latch set signals SET_M<x> and SET_L<y> (x and y being an integer more than 0) for setting data latches M_LTCH and L_LTCH of page buffers PB0 to PB7. Set pulses ① to ⑧ may be sequentially provided to the page buffers PB0 to PB7 each including two data latches M_LTCH and L_LTCH. The set pulse ① may be provided as a latch set signal for setting the data latch M_LTCH of the page buffer PB0 and the data latch L_LTCH of the page buffer PB4. That is, data latches of two page buffers may be simultaneously set by the set pulse ①.

The set pulse ② may be provided as a latch set signal for setting the data latch M_LTCH of the page buffer PB1 and the data latch L_LTCH of the page buffer PB5. The set pulse ③ may be provided as a latch set signal for setting the data latch M_LTCH of the page buffer PB2 and the data latch L_LTCH of the page buffer PB6. The set pulse ④ may be provided as a latch set signal for setting the data latch M_LTCH of the page buffer PB3 and the data latch L_LTCH of the page buffer PB7. The set pulse ⑤ may be provided as a latch set signal for setting the data latch M_LTCH of the page buffer PB4 and the data latch L_LTCH of the page buffer PB0. The set pulse ⑥ may be provided as a latch set signal for setting the data latch M_LTCH of the page buffer PB5 and the data latch L_LTCH of the page buffer PB1. Likewise, data latches of at least two page buffers may be set by each of the set pulses ⑦ and ⑧.

Accordingly, a page buffer unit used to program a 2-bit multi-level cell may use a set pulse to set data latches of at least two page buffers. Thus, a time and a power required to verify whether programming of a memory cell is completed (i.e., at a program verification operation) may be reduced.

Figure 7:
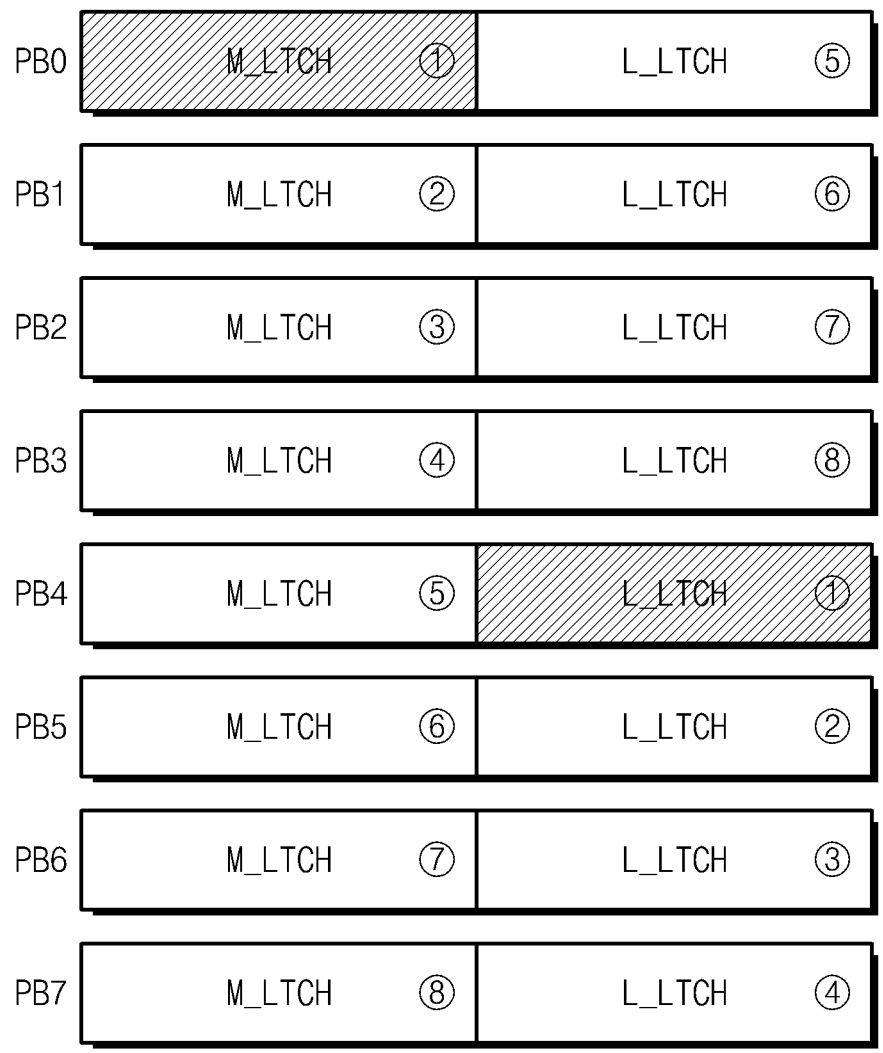
FIG. 7 is a diagram describing a data latch setting order of eight page buffers, according to an example embodiment.

FIG. 7 is a diagram describing a data latch setting order of eight page buffers, according to an example embodiment.

Referring to FIG. 7, there are shown set pulses ① to ⑧ provided to eight page buffers PB0 to PB7. According to the example embodiment as shown in FIG. 7, it is assumed that resultant data of a verification read operation on memory cells is stored at sensing latches S_LTCH of the page buffers PB0 to PB7. Also, it is assumed that data corresponding to a target state is stored at latches M_LTCH and L_LTCH of each of the page buffers PB0 to PB7.

A sensing operation for setting a data latch may be executed following a sensing node develop operation on the page buffers PB0 to PB7. At this time, a set pulse ① may be simultaneously applied to an MSB latch M_LTCH of the page buffer PB0 and an LSB latch L_LTCH of the page buffer PB4. The LSB latch L_LTCH of the page buffer PB4 may maintain a target state or may be set to an inhibit state by the set pulse ①.

A set pulse ② may be simultaneously applied to an MSB latch M_LTCH of the page buffer PB1 and an LSB latch L_LTCH of the page buffer PB5. The MSB latch M_LTCH of the page buffer PB1 may maintain a target state or may be set to an inhibit state by the set pulse ② and a developed level of the sensing node SO of the page buffer PB1. At the same time, the LSB latch L_LTCH of the page buffer PB5 may maintain a target state or set to an inhibit state by the set pulse ② and a developed level of the sensing node SO of the page buffer PB5.

An MSB latch M_LTCH of the page buffer PB2 and an LSB latch L_LTCH of the page buffer PB6 may be simultaneously set by a set pulse ③ in the above-described manner. An MSB latch M_LTCH of the page buffer PB3 and an LSB latch L_LTCH of the page buffer PB7 may be simultaneously set by a set pulse ④ in the above-described manner. An MSB latch M_LTCH of the page buffer PB4 and an LSB latch L_LTCH of the page buffer PB0 may be simultaneously set by a set pulse ⑤ in the above-described manner. An MSB latch M_LTCH of the page buffer PB5 and an LSB latch L_LTCH of the page buffer PB1 may be simultaneously set by a set pulse ⑥ in the above-described manner. An MSB latch M_LTCH of the page buffer PB6 and an LSB latch L_LTCH of the page buffer PB2 may be simultaneously set by a set pulse ⑦ in the above-described manner. An MSB latch M_LTCH of the page buffer PB7 and an LSB latch L_LTCH of the page buffer PB3 may be simultaneously set by a set pulse ⑧ in the above-described manner.

Thus, example embodiments provide that data latches of at least two page buffers are set using a set pulse. Accordingly, a time taken and a power consumed at a program verification operation may be remarkably reduced.

Figure 8:
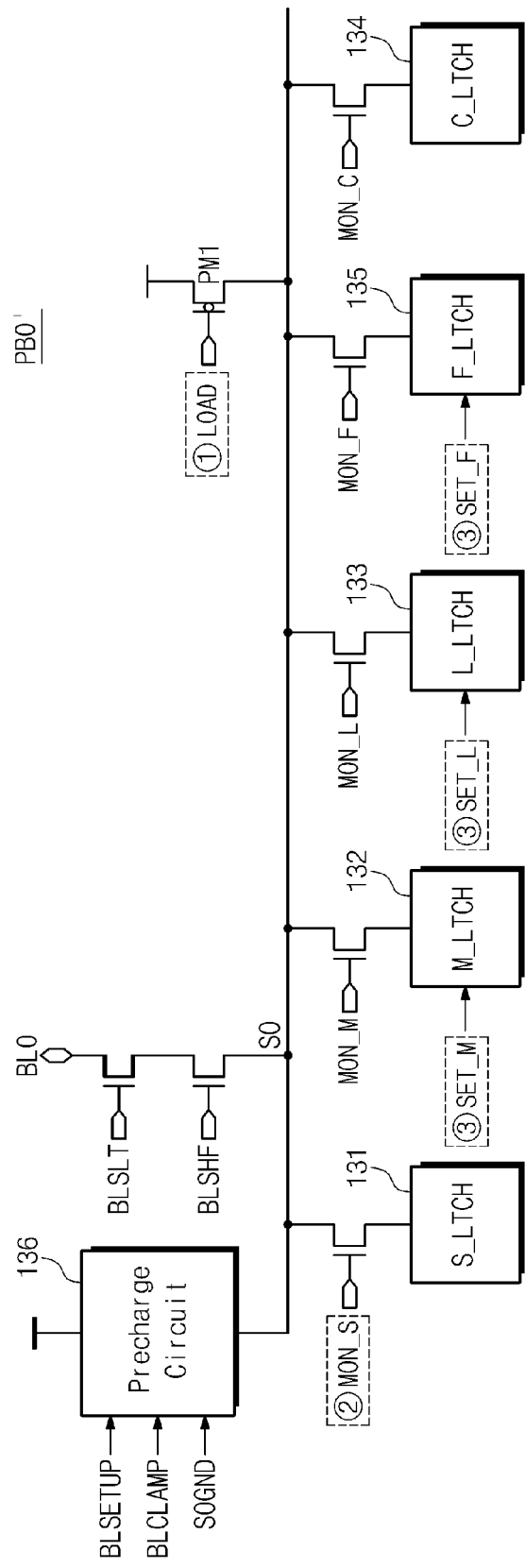
FIG. 8 is a block diagram schematically illustrating a page buffer according to another embodiment of the inventive concepts.

FIG. 8 is a block diagram schematically illustrating a page buffer according to another example embodiment of the inventive concepts.

Referring to FIG. 8, a page buffer PB0' may include may include a sensing latch 131 (labeled as "S_LTCH" in FIG. 8), data latches 132, 133 and 135 (labeled as "M_LTCH", "L_LTCH", and "F_LTCH", respectively, in FIG. 8), a cache latch 134 (labeled as "C_LTCH" in FIG. 8), and a pre-charge circuit 136 which are connected with a sensing node SO. The page buffer PB0 may further include the data latch 135 to program 3-bit data compared with a page buffer PB0 of FIG. 3. Additionally, sensing latch 131 may be coupled with control signal MON_S; data latches 132, 133, and 135 may be couple with control signals MON_M, MON_L, and MON_F, respectively; and the cache latch 134 may be coupled with control signal MON_C.

At a program verification operation, the page buffer PB0' may pre-charge a bit line BL0 and sense an on/off state of a selected memory cell. At this time, the sensing node SO may be provided with a develop result of the bit line BL0. Control logic 140 may activate a control signal LOAD. The page buffer PB0 may pre-charge the sensing node SO in response to an activation of the control signal LOAD. Accordingly, the develop result of the bit line BL0 may be transferred to the sensing node SO. The control logic 140 may apply a control signal BLSHF to the page buffer PB0 such that the bit line BL0 is connected with the sensing node SO. A level of the sensing node SO may vary according to a potential of the bit line BL0. Sensing data may be stored at the sensing latch 131 according to a potential of the sensing node SO developed.

Afterwards, the data latches 132, 133 and 135 may be set according to the sensing data stored at the sensing latch 131. In FIG. 8, reference numbers ①, ② and ③ are used to indicate an execution order.

First, the control signal LOAD for pre-charging the sensing node SO may be activated to transfer data of the sensing latch 131 to the data latch 132 (①). As the control signal LOAD is activated, the sensing node SO may be charged with a driving voltage (VDD) level. A control signal MON_S may be activated such that the sensing node SO is developed according to a data state of the sensing latch 131 (②). When latch set signals SET_M, SET_L and SET_F are activated, a ground transistor TR2 may be turned on or off according to a level of the sensing node SO. At this time, a data latch corresponding to an activated one of the latch set signals SET_M, SET_L and SET_F may be set (③).

If a set pulse is provided to a latch set signal SET_M, it may be used as a latch set signal for setting data latches of different page buffers. Thus, it is possible to set data latches of three page buffers using a set pulse.

Figure 9:
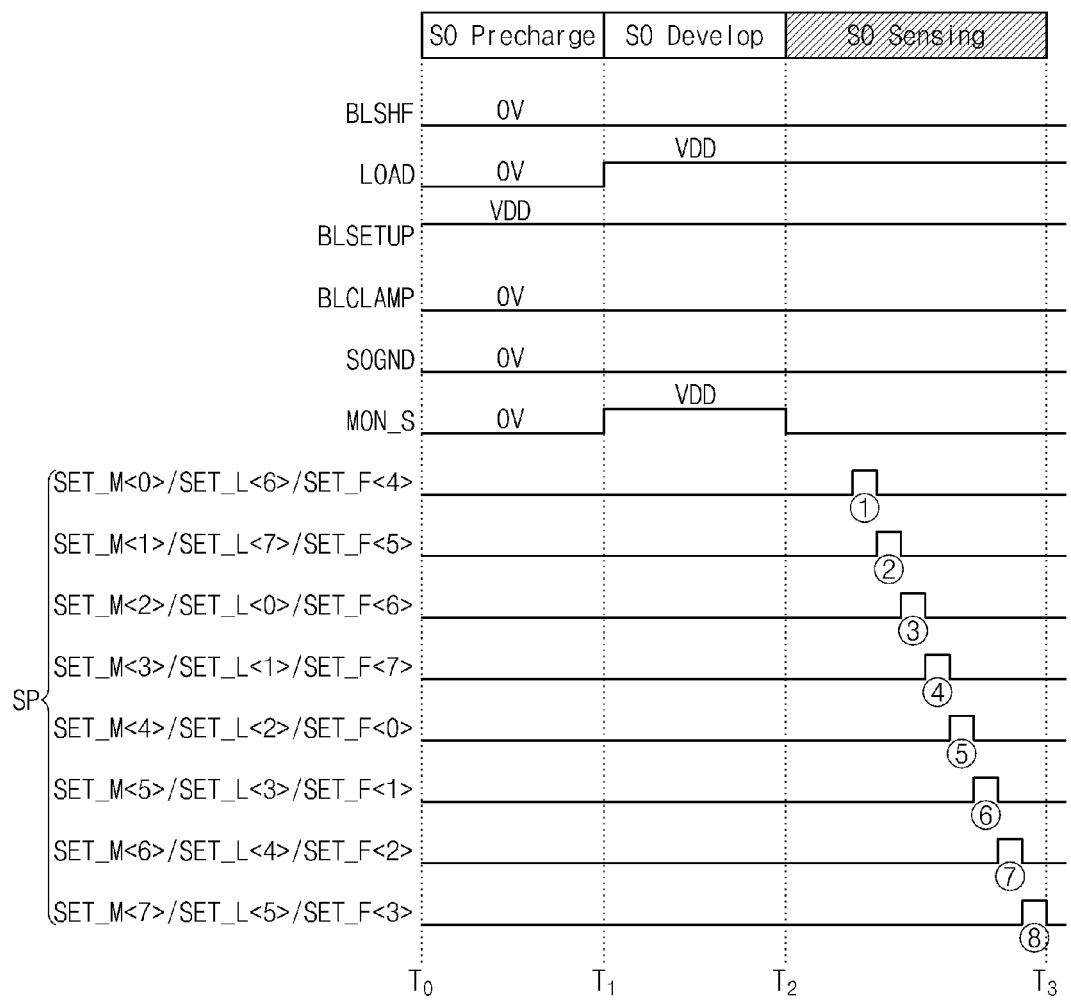
FIG. 9 is a timing diagram schematically illustrating a data latch setting operation of a nonvolatile memory device including a page buffer of FIG. 8.

FIG. 9 is a timing diagram schematically illustrating a data latch setting operation of a nonvolatile memory device including a page buffer of FIG. 8. A data latch setting operation may be divided into three steps according to sensing data stored at a sensing latch S_LTCH of each page buffer.

At T0, a sensing node SO may be pre-charged. This may be achieved by setting a control signal LOAD to a low level (or, 0V). A transistor PM1 may be turned on by the control signal LOAD, so that a level of the sensing node SO increases up to a VDD level or a predetermined voltage level. At this time, control signals BLSHF, BLCLAMP, SOGND, and MON_S may have a level of 0V and a control signal BLSETUP may have a VDD level.

At T1, the sensing node SO may be developed. This may be achieved by setting the control signals LOAD and MON_S to a VDD level. At this time, charge pre-charged at the sensing node SO may be selectively discharged to a ground according to data stored at a sensing latch 131. A ground transistor (not shown) may be turned on or off according to a voltage of the sensing node SO.

At T2, set pulses for setting data latches M_LTCH, L_LTCH, and F_LTCH of page buffers PB0 to PB7 may be applied. Set pulses may be sequentially provided to the page buffers PB0 to PB7 each having three data latches M_LTCH, L_LTCH, and F_LTCH. The set pulse ① may be provided as a latch set signal SET_M<0> for setting the data latch M_LTCH of the page buffer PB0. At the same time, the set pulse ① may be provided as latch set signals SET_L<6> and SET_F<4> for setting the data latch L_LTCH of the page buffer PB6 and the data latch F_LTCH of the page buffer PB4. The data latch L_LTCH of the page buffer PB6 may be a latch of storing LSB target data of a selected memory cell and the data latch F_LTCH of the page buffer PB4 may be a latch of storing a central significant bit (CSB) of the selected memory cell.

The set pulse ② provided following the set pulse ① may be provided as latch set signals SET_M<1>, SET_L<7> and SET_F<5> for setting data latches M_LTCH, L_LTCH and F_LTCH of the page buffers PB1, PB7 and PB5 at the same time. The set pulse ③ provided following the set pulse ② may be provided as latch set signals SET_M<2>, SET_L<0> and SET_F<6> for setting data latches M_LTCH, L_LTCH and F_LTCH of the page buffers PB2, PB0 and PB6 at the same time. The set pulse ④ provided following the set pulse ③ may be provided as latch set signals SET_M<3>, SET_L<1> and SET_F<7> for setting data latches M_LTCH, L_LTCH and F_LTCH of the page buffers PB3, PB1 and PB7 at the same time. Set pulses ⑤ to ⑧ may be provided to at least three page buffers in the above-described manner.

A method of providing a latch set signal to a page buffer unit corresponding to a 3-bit multi-level cell may be described. A set pulse may be applied as latch set signals of at least three page buffers at the same time, and the page buffers may set data latches corresponding to different pages, respectively. With the latch set signal providing method, thus, data latches of all page buffers may be set within a cycle. Thus, a time taken and a power consumed at a program verification operation may be minimized.

Figure 10:
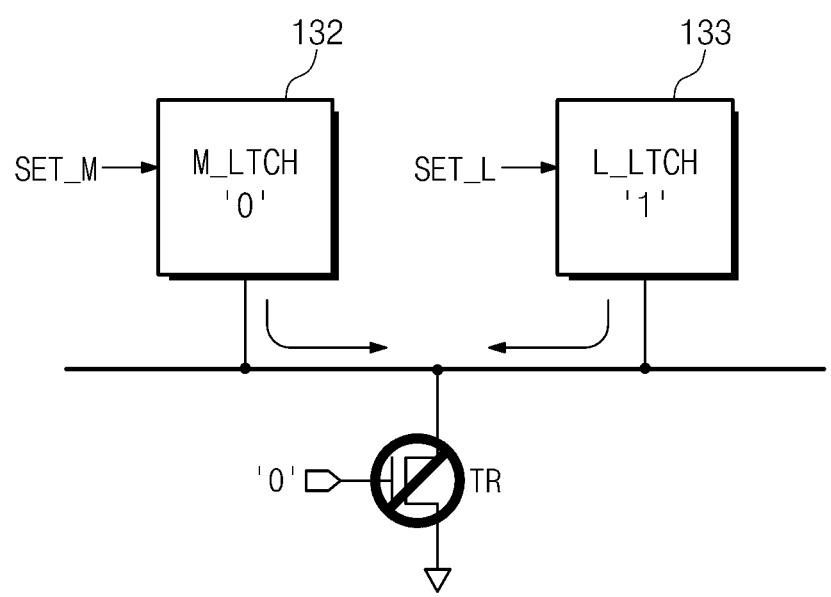
FIG. 10 is a diagram describing an effect of the inventive concepts.

FIG. 10 is a diagram describing an effect of the inventive concepts.

Referring to FIG. 10, latches M_LTCH and L_LTCH in a page buffer are not set at the same time. According to the example embodiment as shown in FIG. 10, it is assumed that logical 0 and logical 1 are stored at the data latches M_LTCH and L_LTCH, respectively as target data values.

In the event that a sensing node SO is developed to a logical 0 at a verification read operation, a ground transistor TR may be turned off. If latch set signals SET_M and SET_L are activated at the same time, target data 0 stored at the data latch M_LTCH may collide with target data 1 stored at the data latch L_LTCH. Thus, data states of the data latches M_LTCH and L_LTCH may not be secured. This may cause an error of a program operation.

With a data latch setting method of the inventive concepts, a set pulse may be provided as latch set signals for setting data latches of different page buffers. In addition, since each of the page buffers provided with the latch set signal sets one data latch, the reliability of data may be maintained.

Figure 11:
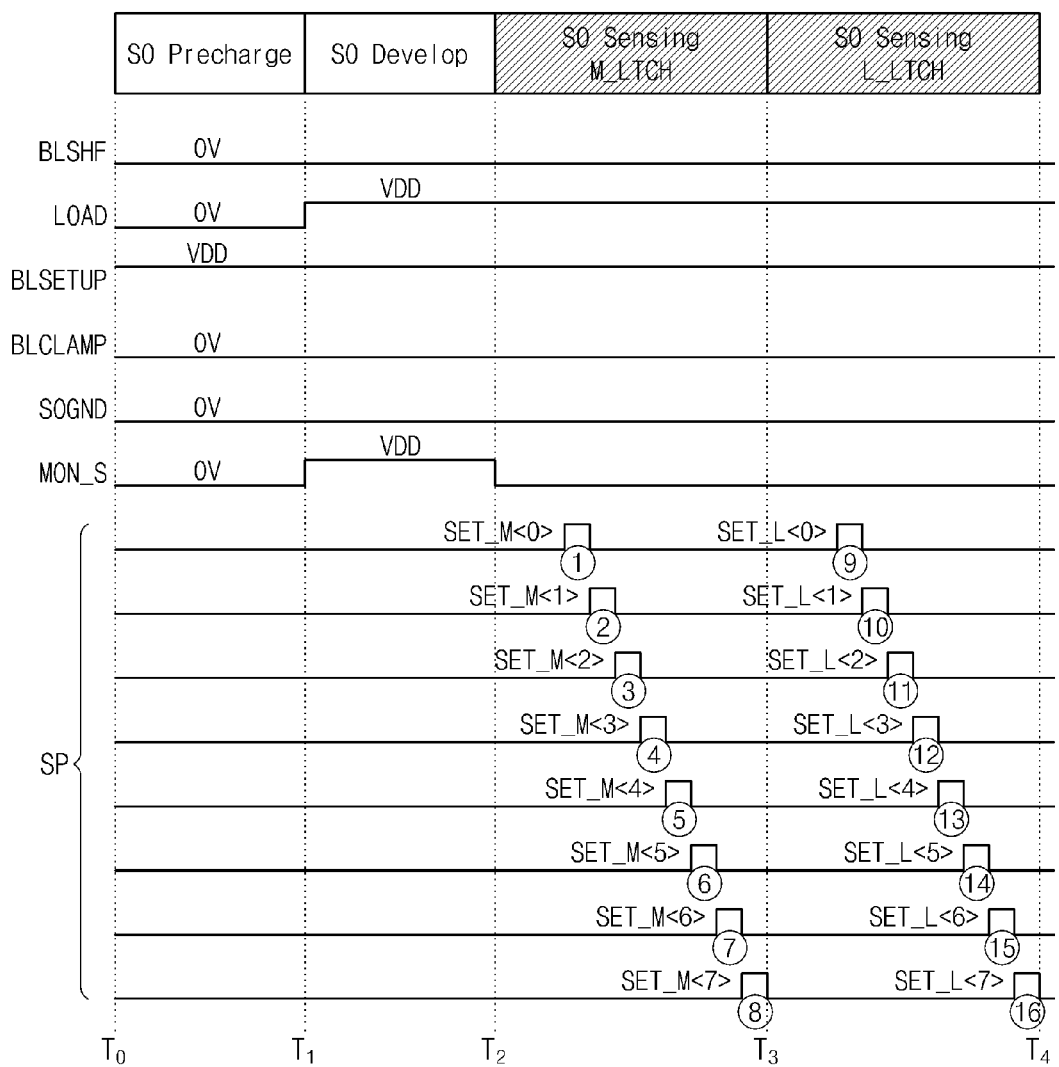
FIG. 11 is a timing diagram schematically illustrating a data latch setting method according to still another embodiment of the inventive concepts.

FIG. 11 is a timing diagram schematically illustrating a data latch setting method according to still another embodiment of the inventive concepts.

Referring to FIG. 11, at a program verification operation, an operation of developing a sensing node SO may be performed once and an operation of setting data latches of page buffers may be performed two times. That is, data latches M_LTCH of page buffers storing MSB data may be set within a cycle, and data latches L_LTCH of the page buffers storing LSB data may be set within a subsequent cycle, At T0, a sensing node SO may be pre-charged. This may be achieved by setting a control signal LOAD to a low level (or, 0V). A transistor PM1 may be turned on by the control signal LOAD, so that a level of the sensing node SO increases up to a VDD level or a predetermined voltage level. At this time, control signals BLSHF, BLCLAMP, SOGND, and MON_S may have a level of 0V and a control signal BLSETUP may have a VDD level.

From T0 to T2, operations of pre-charging and developing the sensing node SO may be performed in the same or similar manner as described above with respect to FIG. 6.

From T2 to T3, set pulses ① to ⑧ for setting data latches M_LTCH of page buffers PB0 to PB7 may be sequentially provided. During a clock cycle corresponding to a duration between T2 and T3, the set pulses ① to ⑧ may be provided as latch set signals SET_M<0> to SET_M<7> of the page buffers PB0 to PB7. During a time when a data state of the sensing node SO is maintained, set pulses ⑨ to (16) for setting data latches L_LTCH of the page buffers PB0 to PB7 may be sequentially provided at a clock cycle period between T3 and T4. During a clock cycle corresponding to a duration between T3 and T4, latch set signals SET_L<0> to SET_L<7> of the page buffers PB0 to PB7 may be provided.

A method of setting data latches of page buffers for a 2-bit multi-level cell is described above. However, the inventive concepts are not limited thereto. Data latches of different page buffers may be simultaneously set during a clock cycle. In a multi-level cell storing three or more bits, a cycle of setting a plurality of data latches may be executed after sensing node pre-charge and develop steps.

Figure 12:
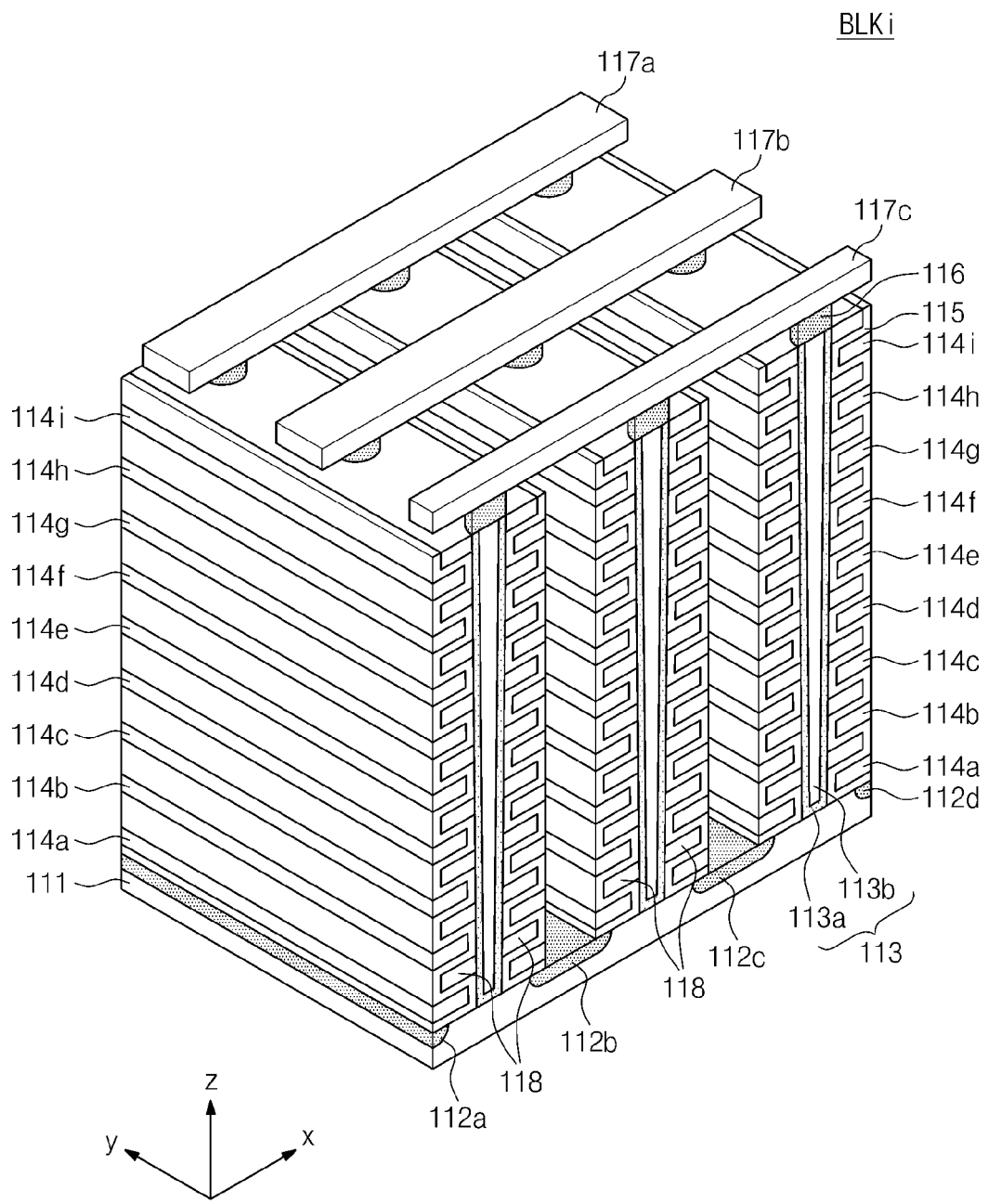
FIG. 12 is a perspective view illustrating one memory block of a cell array of FIG. 1.

FIG. 12 is a perspective view illustrating one memory block of a cell array of FIG. 1. Referring to FIG. 12, a memory block BLKi may include structures extending along a plurality of directions represented by an x, y, and z axes of a Cartesian coordinate system.

A substrate 111 may be provided to form the memory block BLKi. The substrate 111 may be formed of a p-well in which boron, for example, is injected, for example. Alternatively, the substrate 111 may be a pocket p-well provided within an n-well. According to the example embodiment as shown in FIG. 12, it is assumed that the substrate 111 is a p-well. However, according to various embodiments, the substrate 111 may be an n-well.

A plurality of doping regions 112a, 112b, 112c, and 112d extending along the x-direction may be provided in the substrate 111. For example, the plurality of doping regions 112a, 112b, 112c, and 112d may be formed of n-type conductors different from that of the substrate 111. Below, it is assumed that first to fourth doping regions 112a, 112b, 112c, and 112d are n-type. However, the first to fourth doping regions 112a, 112b, 112c, and 112d are not limited to the n-type.

On the substrate 111 between the first and second doping regions 112a and 112b, a plurality of insulation materials 118 extending along the y-direction may be provided sequentially along the z-direction. The insulation materials 118 may be formed to be spaced apart along the z-direction. For example, the insulation materials 118 may include an insulation material such as silicon oxide.

On the substrate 111 between the first and second doping regions 112a and 112b, a plurality of pillars 113 may be arranged sequentially along the y-direction so as to penetrate the plurality of insulation materials 118 along the z-direction. For example, the pillars 113 may contact with the substrate 111 through the insulation materials 118. According to various embodiments, the pillar 113 may also be formed on the substrate 111 between the second and third doping regions 112b and 112c and on the substrate 111 between third and fourth doping regions 112c and 112d.

In example embodiments, each pillar 113 may be formed of a plurality of materials. For example, a surface layer 113a of each pillar 113 may include a first type of silicon material. The surface layer 113a of each pillar 113 may include a silicon material having the same type as that of the substrate 111. It is assumed that the surface layer 113a of each pillar 113 includes p-type silicon. However, the surface layer 113a of each pillar 113 is not limited to the p-type silicon. An inner layer 113b of each pillar 113 may be formed of an insulation material. For example, the inner layer 113b of each pillar 113 may include an insulation material such as silicon oxide.

An insulation film 115 may be provided between the first and second doping regions 112a and 112b along exposed surfaces of the insulation materials 118, the pillars 113, and the substrate 111. In example embodiments, the insulation film 115 can be removed which is provided on an exposed surface (toward the z-direction) of the last insulation material 118 provided along the z-direction.

At a region between the first and second doping regions 112a and 112b, first conductive materials 114a to 114i may be provided on an exposed surface of the insulation film 115. For example, the first conductive material 114a extending along the y-direction may be provided between the substrate 111 and the insulation material 118 adjacent to the substrate 111. The first conductive material 114a extending in the x-direction may be provided between the substrate 111 and the insulation film 115 of a lower surface of the insulation material 118 adjacent to the substrate 111.

The same or similar structure as that on the first and second doping regions 112a and 112b may be provided between the second and third doping regions 112b and 112c. The same or similar structure as that on the first and second doping regions 112a and 112b may be provided at an area between the third and fourth doping regions 112c and 112d.

Each one of the drains 116 may be provided on each one of the pillars 113, respectively. The drains 116 may be second-type silicon materials. According to various embodiments, the drains 116 may be n-type silicon materials. It is assumed that the drains 116 include n-type silicon materials. However, the drains 116 are not limited to include n-type silicon materials.

Second conductive materials 117a to 117c extending along the x-direction may be provided on the drains 116, respectively. The second conductive materials 117a to 117c may be disposed sequentially along the y-direction. The second conductive materials 117a to 117c may be connected with corresponding drains 116, respectively. For example, the drains 116 and the conductive material 117c extending along the x-direction may be connected via contact plugs, respectively.

According to various embodiments, each of the first conductive materials 114a to 114i may form a word line or a selection line SSL/GSL. The first conductive materials 114b to 114h may be used as word lines, and first conductive materials formed at the same layer may be interconnected. The memory block BLKi may be selected when the first conductive materials 114a to 114i all are selected. On the other hand, a sub-block may be selected by selecting a part of the first conductive materials 114a to 114i.

The number of layers at which first conductive materials 114a to 114i are formed may not be limited to this disclosure. It is well understood that the number of layers at which the first conductive materials 114a to 114i are formed is changed according to a process technique and a control technique.

Figure 13:
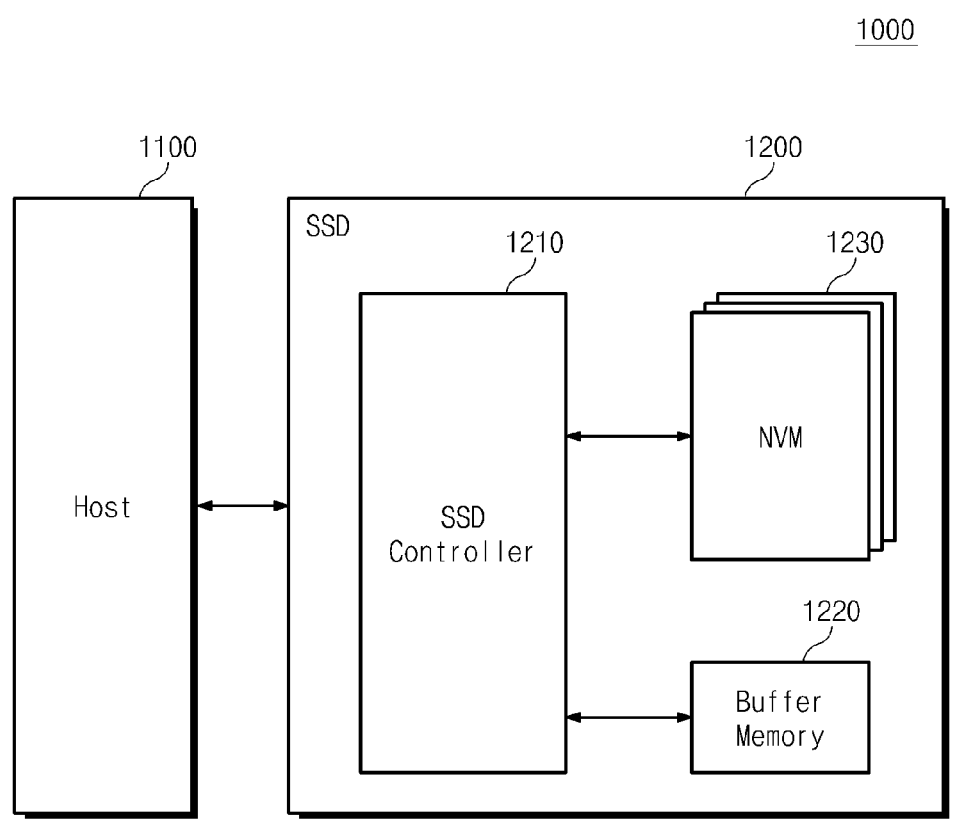
FIG. 13 is a block diagram illustrating a user device including a solid state drive according to an embodiment of the inventive concepts.

FIG. 13 is a block diagram illustrating a user device including a solid state drive according to an example embodiment of the inventive concepts. Referring to FIG. 13, a user device 1000 may include a host 1100 and a solid state drive (hereinafter, referred to as SSD) 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100 to access the nonvolatile memory device 1230 based on the decoding result. The bus format of the host 1100 may include Universal Serial Bus (USB), Small Computer System Interface (SCSI), PCI express, ATA, PATA or Parallel ATA, Serial ATA (SATA), Serial Attached SCSI (SAS), and/or other like bus formats.

The buffer memory 1220 may temporarily store write data provided from the host 1100 or data read out from the nonvolatile memory device 1130. In the event that data existing in the nonvolatile memory device 1230 is cached, at a read request of the host 1100, the buffer memory 1220 may support a cache function to provide cached data directly to the host 1100. According to various embodiments, a data transfer speed of a bus format (e.g., SATA or SAS) of the host 1100 may be higher than that of a memory channel of the SSD 1200. That is, in the event that an interface speed of the host 1100 is relatively fast, lowering of the performance due to a speed difference may be minimized by providing the buffer memory 1220, which may have a relatively large storage capacity.

The nonvolatile memory device 1230 may be used as a storage medium of the SSD 1200. The nonvolatile memory device 1230 may be formed of a NAND flash memory with a mass storage capacity. The nonvolatile memory device 1230 may be formed of a plurality of memory devices. In this case, the memory devices of the nonvolatile memory device 1230 may be connected with the SSD controller 1210 by the channel unit. Data latches of page buffers in the nonvolatile memory device 1230 may be set according to a manner of the inventive concepts. Thus, in the SSD 1000 of the inventive concepts, a time taken and a power consumed to set data latches at a program operation may be reduced.

Example embodiments provide that a storage medium, such as the nonvolatile memory device 1230, is formed of a NAND flash memory. However, the nonvolatile memory device 1230 is not limited to a NAND flash memory device. For example, a storage medium of the SSD 1200 can be formed of a PRAM, an MRAM, a ReRAM, a FRAM, a NOR flash memory, and the like. Further, the inventive concepts may be applied to a memory system which uses a combination of different types of memory devices. According to various embodiments, the nonvolatile memory device 1230 may include a buffer area for a buffer program operation and a main area for a main program operation.

Figure 14:
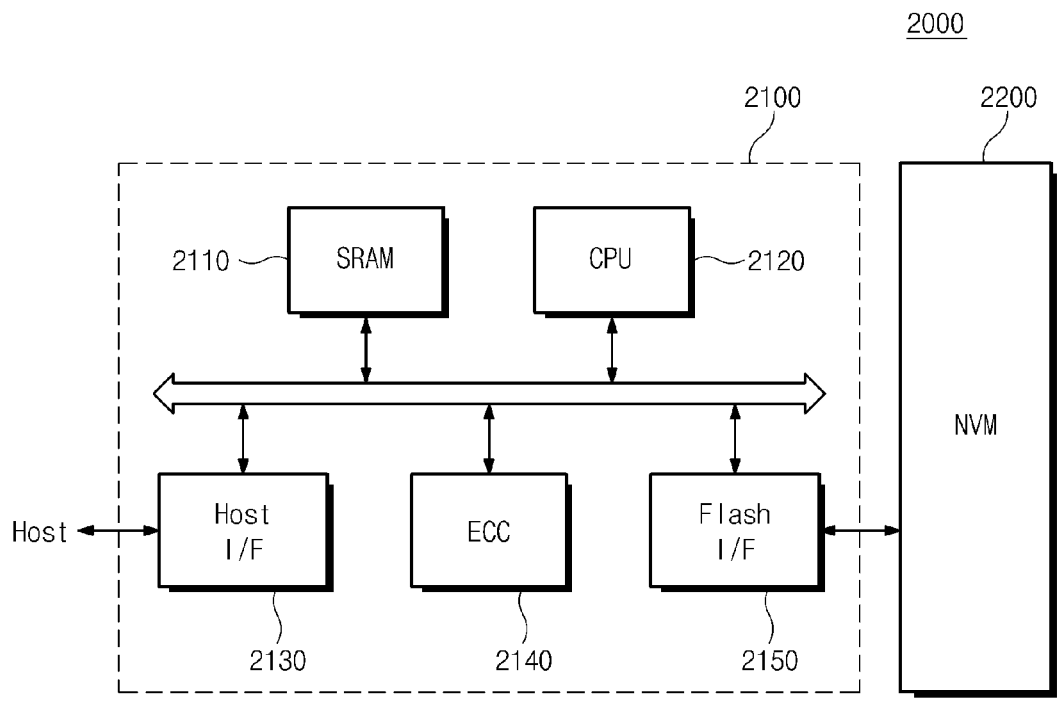
FIG. 14 is a block diagram illustrating a memory system according to another embodiment of the inventive concepts.

FIG. 14 is a block diagram illustrating a memory system according to another example embodiment of the inventive concepts. Referring to FIG. 14, a memory system 2000 may include a memory controller 2100 and a nonvolatile memory (NVM) 2200.

The nonvolatile memory 2200 may be configured substantially the same as described in conjunction with FIG. 1. The nonvolatile memory 2200 may be configured such that a set pulse is provided as a latch set signal of at least two different page buffers at a program verification operation. Thus, since the number of cycles for program verification is reduced, it is possible to improve a program speed and to reduce power consumption.

The memory controller 2100 may be configured to control the nonvolatile memory device 2200. An SRAM 2110 may be used as a working memory of a CPU 2120. A host interface 2130 may include a data exchange protocol of a host connected with the memory system 2000. An ECC block 2140 may be configured to detect and correct errors included in data read out from the nonvolatile memory 2200. A memory interface 2150 may interface with the nonvolatile memory 2200 according to an embodiment of the inventive concepts. The CPU 2120 may execute an overall control operation for data exchange of the memory controller 2100. Although not shown in FIG. 14, the memory system 2000 may further include ROM which stores code data for interfacing with the host.

The memory controller 2100 may communicate with an external device (e.g., host) via at least one interface protocols such as USB, MMC, PCI-E, SAS, SATA, PATA, SCSI, ESDI, IDE, and/or other like interface protocols.

In example embodiments, the memory system 2000 may be applied to, or used with a computer, portable computer, Ultra Mobile PC (UMPC), workstation, net-book, PDA, web tablet, wireless phone, mobile phone, smart phone, digital camera, digital audio recorder/player, digital picture/video recorder/player, a device capable of transmitting and receiving information at a wireless circumstance, or other like user devices constituting home network.

Figure 15:
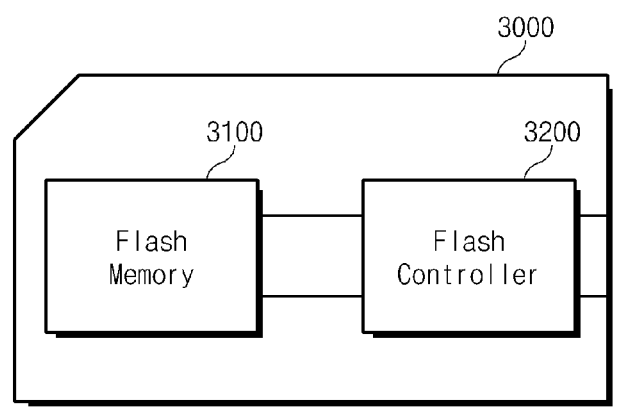
FIG. 15 is a block diagram illustrating a data storage device according to an embodiment of the inventive concepts.

FIG. 15 is a block diagram illustrating a data storage device according to an example embodiment of the inventive concepts. Referring to FIG. 15, a data storage device 3000 may include a flash memory 3100 and a memory controller 3200. The memory controller 3200 may control the flash memory 3100 in response to control signals input from the outside of the data storage device 3000.

The flash memory 3100 may be configured similarly or the same as a nonvolatile memory device 100 of FIG. 1. According to various embodiments, the flash memory 3100 may be a multi-chip. The flash memory 3100 may have one of a stack flash structure in which arrays are stacked at multiple layers, a source-drain free flash structure, a pin-type flash structure, and a three-dimensional flash structure.

The data storage device 3000 may form a memory card device, an SSD device, a multimedia card device, an SD card, a memory stick device, a HDD device, a hybrid drive device, or an USB flash device. For example, the data storage device 3000 may form a card which satisfies the industry standards for using user devices such as a digital camera, a personal computer, and so on.

Figure 16:
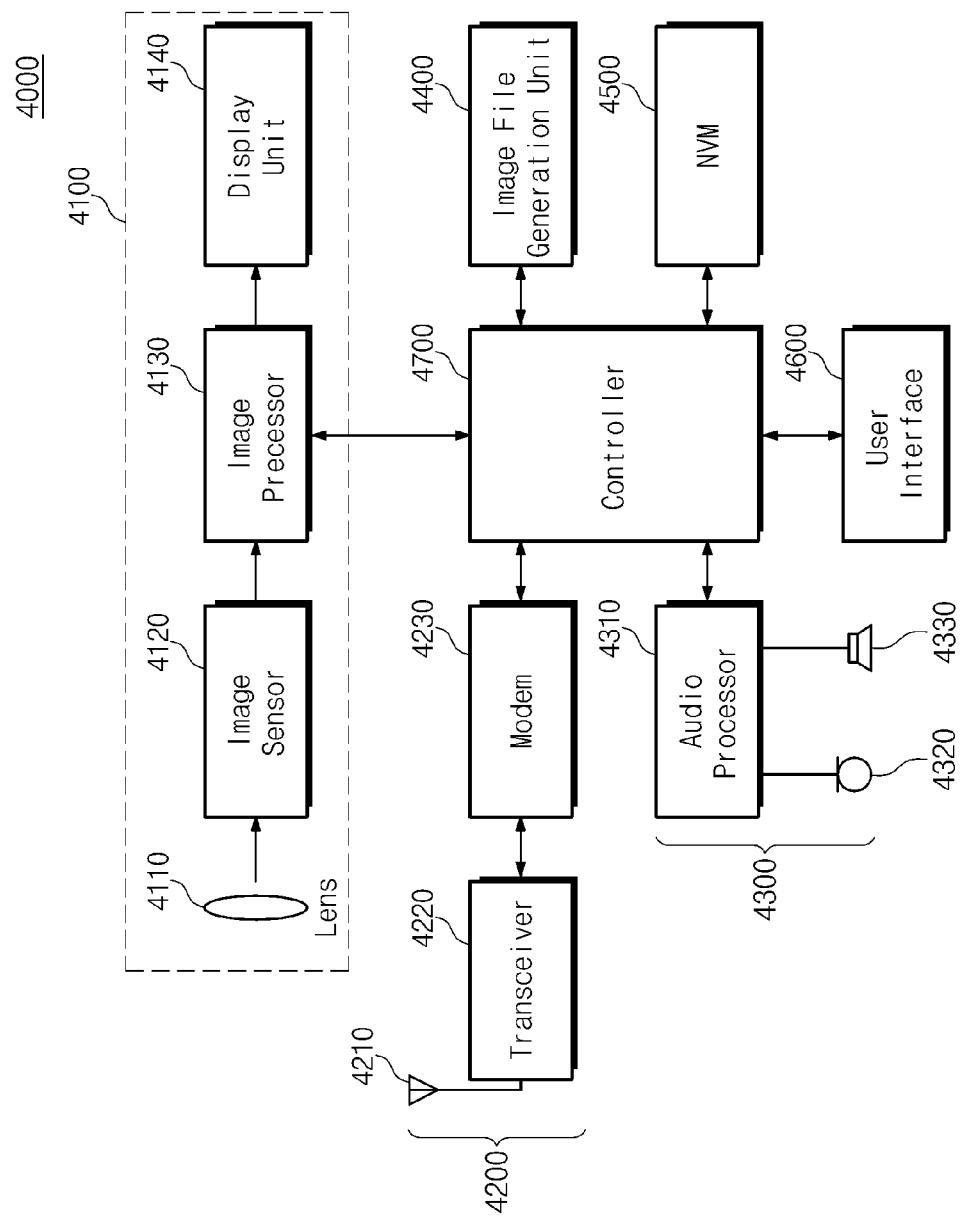
FIG. 16 is a block diagram schematically illustrating a handheld terminal according to an embodiment of the inventive concepts.

FIG. 16 is a block diagram schematically illustrating a handheld terminal according to an example embodiment of the inventive concepts.

Referring to FIG. 16, a handheld terminal 400 may include an image processing block 4100, a wireless transceiver block 4200, an audio processing block 4300, an image file generation unit 4400, a nonvolatile memory device 4500, a user interface 4600, and a controller 4700.

The image processing block 4100 may include an image sensor 4120 that is optionally coupled with a lens 4110, an image processor 4130, and a display unit 4140. The wireless transceiver block 4200 may include an antenna 4210, a transceiver 4220, and a modem 4230. The audio processing block 4300 may include an audio processor 4310, a microphone 4320, and a speaker 4330.

Before image data provided from the image sensor 4120 is transferred to a codec, the image processor 4130 may pre-process the image data provided from the image sensor 4120, so that bandwidth margin of a channel is secured.

The nonvolatile memory device 4500 may be a nonvolatile memory device that is driven according to an example embodiment of the inventive concepts. In this case, the nonvolatile memory device 4500 may provide the high write performance and respond within a time out period of the handheld terminal 4000.

A nonvolatile memory device and/or a memory controller may be packed by one selected from various types of packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and/or other like packages.

While the inventive concepts have been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device, comprising:
a cell array including a plurality of memory cells;
a page buffer unit including a plurality of page buffers and configured to perform a program verification operation in order to sense whether programming of selected memory cells is completed, and each of the plurality of page buffers includes a first data latch and a second data latch; and
a control logic configured to provide a set pulse for setting the first data latch and the second data latch of each of the plurality of page buffers to a program inhibit state according to a result of the program verification operation, the control logic providing the set pulse to at least two of the plurality of page buffers simultaneously such that the first data latch of a first one of the at least two of the plurality of page buffers and the second data latch of a second one of the at least two of the plurality of page buffers are set at the same time.

2. The nonvolatile memory device of claim 1, wherein each of the plurality of page buffers further comprises a sensing latch for latching data corresponding to the result of the program verification operation.

3. The nonvolatile memory device of claim 2, wherein the control logic further provides a plurality of set pulses for setting the first data latch and the second data latch of the page buffers during a clock cycle.

4. The nonvolatile memory device of claim 1, wherein for each of the plurality of page buffers,
the first data latch is configured to store a first bit to be programmed at a corresponding memory cell; and
the second data latch is configured to store a second bit to be programmed at the corresponding memory cell.

5. The nonvolatile memory device of claim 4, wherein the set pulse is simultaneously provided as a first latch set signal for setting the first data latch of the first one of the at least two of the plurality of page buffers and as a second latch set signal for setting the second data latch of the second one of the at least two of the plurality of page buffers.

6. The nonvolatile memory device of claim 4, wherein the first bit corresponds to a most significant bit (MSB) of multiple bits to be programmed at the corresponding memory cell and the second bit is another one of the multiple bits.

7. The nonvolatile memory device of claim 4, wherein the control logic is configured to provide a first pulse stream for setting the first data latches of the page buffers and a second pulse stream for setting the second data latches of the page buffers.

8. The nonvolatile memory device of claim 7, wherein the first pulse stream is provided during a first clock cycle period and the second pulse stream is provided during a second clock cycle period, the second clock cycle period following the first clock cycle period.

9. A nonvolatile memory device, comprising:
- a first page buffer including a first most significant bit (MSB) data latch and a first least significant bit (LSB) data latch;
- a second page buffer including a second most significant bit (MSB) data latch and a second least significant bit (LSB) data latch; and
- a control logic configured to control the first page buffer and the second page buffer by applying a set pulse simultaneously to both the first most significant bit (MSB) page buffer and the second least significant bit (LSB) page buffer, and
  - the first page buffer is configured to store first most significant bit (MSB) data in the first most significant bit (MSB) data latch in response to the set pulse, and
  - the second page buffer is configured to store second least significant bit (LSB) data in the second least significant bit (LSB) data latch in response to the set pulse.

10. The nonvolatile memory device of claim 9, wherein
- the first page buffer includes a first sensing latch, and the first page buffer is configured to store the first most significant bit (MSB) data in the first most significant bit (MSB) data latch according to the first most significant bit (MSB) data stored in the first sensing latch; and
- the second page buffer includes a second sensing latch, and the second page buffer is configured to store the second least significant bit (LSB) data in the second least significant bit (LSB) data latch according to the second least significant bit (LSB) data stored in the second sensing latch.

11. The nonvolatile memory device of claim 10, wherein the first page buffer and the second page buffer are each configured to maintain a target state in response to the set pulse.

12. The nonvolatile memory device of claim 10, wherein the control logic is further configured to set the first page buffer and the second page buffer to a program inhibit state if a result of a program verification operation indicates that a programming operation has been completed.

13. The nonvolatile memory device of claim 12, wherein
- the first sensing latch is configured to store the first most significant bit (MSB) data corresponding to the result of the program verification operation, and
- the second sensing latch is configured to store the second least significant bit (LSB) data corresponding to the result of the program verification operation.

14. The nonvolatile memory device of claim 12, wherein the first most significant bit (MSB) data latch is configured to store most significant bit (MSB) data of the first page buffer and the second data latch is configured to store least significant bit (LSB) data of the second page buffer.

* * * * *